United States Patent
Kaplinsky

[11] Patent Number: 5,568,062
[45] Date of Patent: Oct. 22, 1996

[54] LOW NOISE TRI-STATE OUTPUT BUFFER

[76] Inventor: Cecil H. Kaplinsky, 140 Melville Ave., Palo Alto, Calif. 94301

[21] Appl. No.: 502,531

[22] Filed: Jul. 14, 1995

[51] Int. Cl.$^6$ ................................................. H03K 17/16
[52] U.S. Cl. ........................... 326/27; 326/87; 326/58
[58] Field of Search .............................. 326/83, 87, 58, 326/21, 27

[56] References Cited

U.S. PATENT DOCUMENTS

| | | | |
|---|---|---|---|
| 4,727,266 | 2/1988 | Fujii | 326/27 |
| 4,731,553 | 3/1988 | Van Lehn | 326/87 |
| 4,797,579 | 1/1989 | Lewis | 326/27 |
| 4,806,794 | 2/1989 | Walters, Jr. | 307/451 |
| 5,036,222 | 7/1991 | Davis | 326/87 |
| 5,081,374 | 1/1992 | Davis | 326/58 |
| 5,118,974 | 6/1992 | Yarbrough et al. | 307/473 |
| 5,122,690 | 6/1992 | Bianchi | 326/87 |
| 5,184,034 | 2/1993 | Ohannes et al. | 307/473 |
| 5,187,686 | 2/1993 | Tran et al. | 365/189.11 |
| 5,256,916 | 10/1993 | Thurston | 307/451 |
| 5,258,665 | 11/1993 | Ward et al. | 307/443 |
| 5,306,965 | 4/1994 | Asprey | 326/112 |
| 5,311,076 | 5/1994 | Park et al. | 307/443 |
| 5,331,593 | 7/1994 | Merritt et al. | 365/189.11 |
| 5,355,029 | 10/1994 | Houghton et al. | 307/443 |
| 5,378,943 | 1/1995 | Dennard | 326/68 |
| 5,381,059 | 1/1995 | Douglas | 326/58 |
| 5,438,277 | 8/1995 | Sharpe-Geisler | 326/87 |

*Primary Examiner*—Edward P. Westin
*Assistant Examiner*—Andrew Sanders
*Attorney, Agent, or Firm*—Thomas Schneck

[57] ABSTRACT

A buffer circuit includes a pair of pull-up output transistors and a pair of pull-down output transistors driving an output line. Each output transistor is driven by its own tristate input translator, all connected to an input terminal of the circuit. Two of the translators are tristated by control signals received as feedback from the output line to turn off one of the pull-up transistors when the output exceeds the high logic level transition voltage (2.2 V) and to turn off one of the pull-down transistors when the output drops below the low logic level transition voltage (0.8 V). This not only prevents ground bounce or overshoot of the output, but also avoids larger current flow or power dissipation from pull-up and pull-down transistors being simultaneously partially on during a transition. Because the output transistors are driven directly by the input translators, throughput speed is improved, while ramp rate of the translator outputs driving the output transistors can remain slow to reject input noise spikes and avoid generation of output noise.

8 Claims, 2 Drawing Sheets

LOW NOISE TRI-STATE OUTPUT BUFFER

TECHNICAL FIELD

The present invention relates to electronic digital logic circuitry for interfacing, i.e. buffering logic signals, between different circuit elements, for example between on-chip circuitry and conductive traces on a printed circuit board leading to other integrated circuit chips. The invention particularly relates to buffer circuits with input noise rejection and output switching noise reduction.

BACKGROUND ART

Conventional buffer circuits include a single input translator, i.e. level shifter, that receives an input signal with TTL logic levels (0 V is low, 3.0 V is high) and that translates that signal to CMOS logic levels (0 V is low, 5.0 V is high). In both cases the nominal transition point is 1.5 V. This translated signal is then reinverted through a CMOS inverter, since the translator usually has an inverting as well as translating function, and then goes through a set of logic gates. The logic gates include a disable input so that a high impedance state can be asserted if desired. The set of logic gates then drives pull-up and pull-down output transistors connected to an output line. One problem with such buffer circuits is that of noise generation. While the input signal has a relatively slow ramp rate (3 V/2.5 ns), by the time the signal has made successive transitions in the translator, inverter and logic gates, the ramp rate is approximately 8 times higher (5 V/0.5 ns). This causes the output transistors to open and close quickly, which produces ground bounce or overshoot of the output signal due to the inductance between the integrated circuit chip's internal ground and power supply and external ground and power supply. The buffer circuit also has a relatively slow throughput time due to the many layers of logic between the input and output of the circuit. An ideal buffer would be relatively fast and yet would linearly ramp its output current to a maximum to reduce ground bounce or overshoot and then linearly ramp down its output current to source small DC current sufficient to maintain the final voltage on the output line. It would also reject input noise spikes instead of transmitting them to the output.

In U.S. Pat. No. 5,381,059, Douglas describes a tristate buffer circuit with parallel pairs of pull-up and pull-down transistors that are driven by separate control signals. A feedback circuit coupled between the output node and the pull-up transistors prevents leakage current from flowing in the buffer. Like conventional circuits, there is considerable logic between the data input terminal and the transistors in the output stage.

In U.S. Pat. No. 5,355,029, Houghton et al. describe a circuit with parallel drivers, each with their own predriver stage. Like conventional buffers, the predriver stages consist of transistors forming AND and NOR gates connected to the output of a single input transistor.

In U.S. Pat. No. 4,806,794, Walters, Jr. describes a buffer circuit with an output stage having dynamic pull-up and pull-down circuit elements that drive the output transistors and a keeper circuit element. The keeper maintains the output node at the high or low logic level after it has completed a low-to-high or high-to-low transition. In this case, "after" is defined with respect to a delay generated by the circuitry. Since the delay is a function of the load that the current is driving, proper operation depends to some extent on the load being known. For example, a buffer circuit of this type with a 4.2 nsec propagation time when driving a 50 pF load would have a 10.2 nsec propagation time when driving a 250 pF load. It is desirable in buffer circuits to have the propagation time generally independent of the load, since the load is usually not known in advance.

An object of the present invention is to provide a buffer circuit which is faster, rejects input noise spikes and does not generate noise at the output, and which has low power dissipation.

DISCLOSURE OF THE INVENTION

The above object has been met with a low noise fast buffer circuit having dual tristate input translators in parallel driving a pull-up transistor and a pull-down transistor, respectively with means for shutting off these pull-up and pull-down transistors when the input translators are tristated. (Tristate input translators, inverters and buffers have both high and low output states and also a third high impedance state. These circuit elements are said to be "tristated", i.e. placed in their high impedance state, by a separate control signal input.) Further, the circuit includes a parallel set of pull-up and pull-down transistors that also receive tristatable inputs through another pair of input translators. Feedback means shut off at least one of the pull-up transistors during a low-to-high transition after a logic high transition voltage has been reached at the output, and similarly shut off at least one of the pull-down transistors during a high-to-low transition after a logic low transition voltage has been reached at the output. This prevents overshoot or undershoot of the output.

The circuit filters out unwanted input noise spikes, because the input translators drive the pull-up and pull-down transistors with a relatively slow ramp rate, so that spikes of less than 1 nsec duration and less than 1.8 V peaks do not turn the transistors on sufficiently to pull the output through the transition point. The buffer circuit is also fast, because the input translators drive the pull-up and pull-down transistors directly, rather than through several stages of logic gates.

BEST MODE OF CARRYING OUT THE INVENTION

Figure 1:
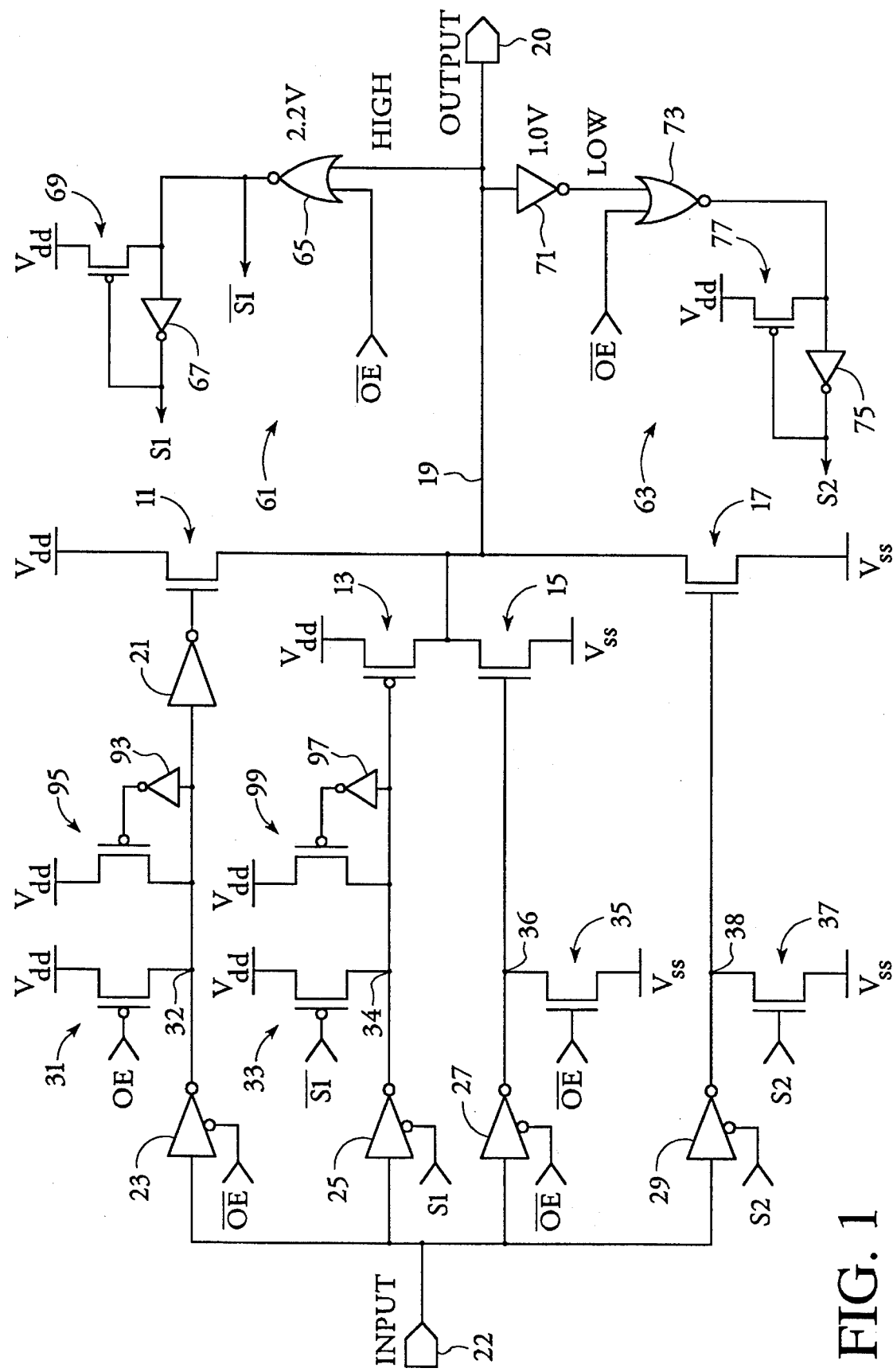
FIG. 1 is a schematic circuit diagram of a buffer circuit of the present invention.

With reference to FIG. 1, a buffer circuit of the present invention includes a first pull-up transistor 11, a second pull-up transistor 13, a first pull-down transistor 15, and a second pull-down transistor 17. All four of these transistors are field-effect transistors connected to an output line 19 to form the output transistors that drive an output terminal 20 of the circuit. The pull-up transistors 11 and 13 are also connected to a first voltage supply line $V_{dd}$, while the pull-down transistors 15 and 17 are connected to a second voltage supply line $V_{ss}$. Typically, the second voltage line $V_{ss}$ is defined as being at the reference or ground voltage (0 V), while the first voltage line $V_{dd}$ is at +5 V. The two pull-down transistors 15 and 17 are n-channel devices, while the second pull-up transistor 13 is a p-channel device. In buffer circuits that operate with TTL input/output logic levels (LOW <0.8 V, HIGH >2.0 V), the first pull-up transistor 11 is preferably an n-channel device with a CMOS inverter 21 between the input stage of the circuit and the control gate of transistor 11. The use of an n-channel device for pull-up transistor 11 minimizes power dissipation for reasons that will be discussed below. Alternatively, if the buffer circuit is to operate with pure CMOS output levels, a p-channel device will substitute for the n-channel pull-up transistor 11 of FIG. 1 and the inverter 21 will be removed. This will enable the output terminal 20 to be pulled all the way up to $V_{DD}$=5 V without the 1 to 1.5 V threshold voltage drop of an n-channel device.

The input terminal 22 of the buffer circuit connects in parallel to four tristate inverting input translators 23, 25, 27 and 29, with a separate translator being provided for driving each one of the four output transistors 11, 13, 15 and 17 respectively. Pull-up transistors 31 and 33 are connected at nodes 32 and 34 between the outputs of input translators 23 and 25 and the inputs of output transistors 11 and 13. In the case of n-channel pull-up transistor 11, the node 32 communicates only indirectly with the gate of transistor 11 via inverter 21. Pull-down transistors 35 and 37 are connected at nodes 36 and 38 between the outputs of input translators 27 and 29 and the inputs of output transistors 15 and 17. Transistors 31 and 33 are p-channel devices connected to first voltage supply line $V_{dd}$, while transistors 35 and 37 are n-channel devices connected to second voltage supply line $V_{ss}$. Transistors 31, 33, 35 and 37 are driven by control signals OE, $\overline{S1}$, $\overline{OE}$, and S2 applied to their gates that cause their corresponding output transistors 11, 13, 15 and 17 to turn off when the input translators 23, 25, 27 and 29 are placed in a high impedance state by related control signals $\overline{OE}$, S1, $\overline{OE}$ and S2.

There are no logic gates, other than the first CMOS inverter 21, between the input translators 23, 25, 27 and 29 and the output transistors 11, 13, 15 and 17. Rather, the input translators drive the output transistors directly. In contrast, in conventional buffer circuits, input signals generally traverse several levels of logic, including NAND or NOR gates, before reaching the output transistors. Time is saved by not going through these extra levels of logic. Thus, this structure leads to a fast buffer.

The input translators 23, 25, 27 and 29 are typically sized to all have a 1.5 V transition voltage, which is the nominal transition voltage for TTL logic. Alternatively, the input translators 23 and 25 that drive the pull-up output transistors 11 and 13 may be sized to have a smaller transition point somewhere between 0.8 V and 1.5 V, for example, 1.2 V, while the input transistors 27 and 29 that drive the pull-down output transistors 15 and 17 may be sized to have a larger transition point somewhere between 1.5 V and 2.0 V, for example 1.8 V. This difference in input thresholds for the translators 23, 25, 27 and 29 hastens the throughput of a transition of an input signal at the input terminal 22 of the circuit, albeit at the expense of some input noise spike rejection, without increasing the ramp rate of the translators' outputs driving the output transistors 11, 13, 15 and 17. Basically, a transition from low-to-high by the input signal is recognized as a transition by the input translators 23 and 25 sooner because their transition point is lower than 1.5 V, and similarly a high-to-low transition is recognized sooner by the input translators 27 and 29 because their transition point is higher than 1.5 V. Driving of the pull-up or pull-down transistors 11, 13, 15 and 17 is at the same ramp rate but occurs sooner after the start of an input signal transition.

In yet another alternative, the translators 23 and 27 driving the weaker output transistors 11 and 15, which are mainly used to complete a transition and maintain the output level after the finish of a transition, may have a 1.5 V transition voltage, while only the translators 25 and 29 driving the stronger output transistors 13 and 17 have different transition voltages as described above.

Figure 2:
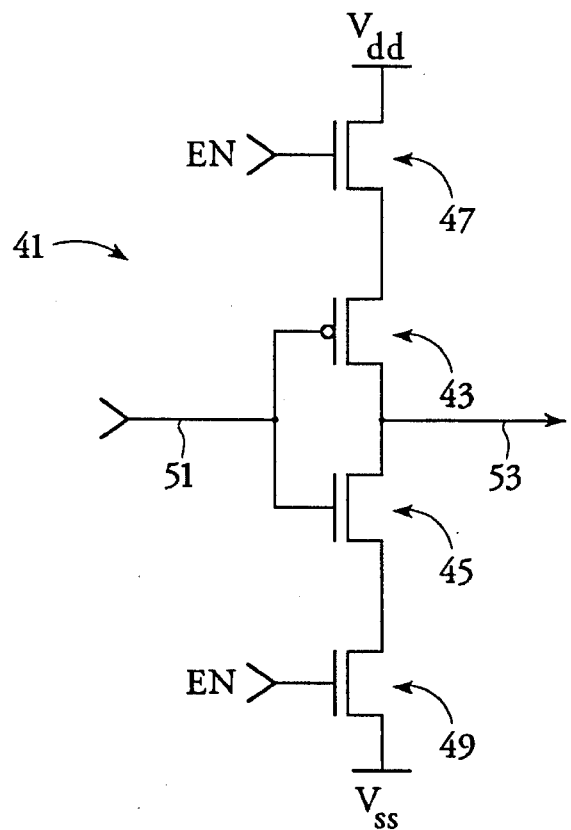
FIG. 2 is a schematic transistor level diagram of an input translator circuit element used in the buffer circuit of FIG. 1.

The circuit minimizes the generation of noise at the output by avoiding ground bounce. The input signal received at the input terminal 22 normally has a relatively slow ramp rate of about 3 V/2.5 ns. However, in conventional buffers by the time the signal has traversed the logic gates to reach the gates of the output transistors, the ramp rate has increased substantially to about 5 V/0.5 ns. This causes the output transistors to open and close quickly, leading to a rapid change in current flow (dI/dt) and ground bounce proportional to L·dI/dt, where L is the inductance between the circuit's ground $V_{ss}$ and an external ground. In the circuit of the present invention, the transistors that make up the input translators 23, 25, 27 and 29, as seen in FIG. 2, have sizes chosen so that their outputs, which directly drive the gates of the output transistors, still have relatively slow ramp rates. In particular, around the transition point, the input translators operate as linear inverting amplifiers, where the output has a transition rate proportional to and at most two times higher than that at its input. Signal transitions of about 2.25 V/ns drive the output transistors 13, 15 and 17. The transistor 11 is driven by the inverter 21, whose output ramp is also slow because of its small size in relation to the load it drives. In addition, the relative size of the output transistors to the input translators is chosen to ensure that the slow transition is maintained by the output transistors. The slow turn on or turn off of the output transistors results in a slow change in current flow (small dI/dt), thereby minimizing ground bounce. Note that the slower transition rates are more than compensated for by the shorter throughput time achieved by the fewer logic levels traversed by the signal.

As seen in FIG. 2, the buffer circuit uses a tristate input translator that includes an inverter element 41 with a p-channel pull-up transistor 43 and an n-channel pull-down transistor 45, and two n-channel transistors 47 and 49 connecting the inverter element 41 to the respective first and second voltage supply lines $V_{dd}$ and $V_{ss}$. The transistors 47 and 49 both have an enable control signal EN applied to their gates. The gates of the transistors 43 and 45 of the inverter element 41 receive an input signal on common input line 51, and provide an inverted and translated output signal on a common output line 53 whenever the transistors 47 and 49 are turned on (EN=high). The output line 53 is in a high impedance state when the transistors 47 and 49 are off (EN=low). The relative strengths or saturation currents of the pull-up and pull-down transistors determine the nominal transition voltage as well as the ramp rate of the output. While the transistor sizes (channel widths and lengths) are process dependent, representative size values for a 1.5 V transition level for TTL input signals and a low ramp rate are 12/0.8 (channel width/channel length in microns) for n-channel transistor 47, 18/0.8 for p-channel transistor 43, and 9/0.8 for both n-channel pull-down transistors 45 and 49. The sizes will differ for translators with other transition levels. If n-channel transistor 47 is replaced by a p-channel transistor so as to pull the output 53 all the way up to $V_{dd}$ instead of just to 3 V, that transistor would have the same 18/0.8 size as transistor 43. The CMOS inverter 21 has p-channel and n-channel transistors whose sizes may both be 19.5/0.8. Transistor 11 is turned on very slowly due to the weak pull-up of inverter 21.

To maintain the slow transition of the output transistors 11, 13, 15 and 17 in FIG. 1 without ground bounce, representative effective sizes using the same transistor process are 700/0.8 for n-channel transistor 11, 620/0.8 for p-channel transistor 13, 120/0.8 for n-channel transistor 15 and 680/0.8 for n-channel transistor 17. Each of these output transistors may be formed by a set of parallel transistors all sized at about 20/0.8. Thus, for example, transistor 11 could be formed by 35 of such parallel transistors.

In addition to avoiding the generation of noise from ground bounce, the buffer circuit also filters out any unwanted input spikes. This can be understood by considering an input transition from low to high. By the time the input signal has risen to 1.8 V, the outputs of the input translators will have fallen only from 5 V to 3.5 V. While this starts the opening of at least the pull-up transistor 13 and the closing of the pull-down transistor 15, neither of these transistors is fully open or shut yet, and the output 20 will not have moved through the transition point, i.e. have dropped below 2.0 V. By contrast, conventional buffers will usually have switched at this point, with their logic outputs fully low and their p-channel pull-up and n-channel pull-down output transistors fully open and shut, respectively. The circuit of the present invention will reject a 1 ns wide input noise spike from 0 V to 1.8 V (or from 3.0 V to 1.2 V) without producing a corresponding spike transition at the output. That is, the output will not rise above 0.8 V (the upper limit of a low logic value) or drop below 2.0 V (the lower limit of a high logic value) when such 1.8 V spikes are received at the input 22.

The buffer circuit in FIG. 1 includes a pair of feedback elements 61 and 63 responsive to the voltage level on the output terminal 20 for controlling the state of two of the output transistors 13 and 17. The feedback element 61 includes a NOR gate 65 with one input connected to the output line 19 and another input connected to receive a disable signal $\overline{OE}$. An inverter 67 with a weak pull-up transistor 69 is connected to the output of NOR gate 65. The NOR gate has a transition point of about 2.2 V. When the output 20 exceeds this transition point, control signal $\overline{S1}$ on the output of NOR gate 65 is low and control signal S1 on the output of inverter 67 is high, tristating the input translator 25 and shutting off output transistor 13. The feedback element 63 includes an inverter 71 connecting the output line 19 of the buffer circuit to an input of another NOR gate 73. Another input of the NOR gate 73 receives a disable signal $\overline{OE}$. A second inverter 75 with a weak pull-up transistor 77 is connected to the output of the NOR gate 73. The inverter 71 has a transition point of 1.0 V. When the output 20 drops below this transition point, control signal S2 on the output of the second inverter 75 is high, tristating the input translator 29 and shutting off output transistor 17. Second pull-down transistor 17 is much larger than first pull-down transistor 15 (about 6× larger) and is big enough to pull the output line 19 down rapidly. Transistor 17 is enabled when the output is high, but is then switched off by control signal S2 when the output falls below 1.0 V. Transistor 15 is used to complete the pull-down of the output at a slow enough rate to avoid undershoot and then to provide the current sink needed to keep the output low. Similarly, second pull-up transistor 13 is stronger than first pull-up transistor 11 and is used to pull the output line 19 up rapidly until the output exceeds 2.2 V. Then control signals S1 and $\overline{S1}$ shut the transistor 13 off. Transistor 11 completes the pull-up (to about 3.0 V) and sustains the high output level.

This use of two pull-up output transistors and two pull-down output transistors of different strengths when one pull-up or pull-down transistor is turned off after the logic transition level has been reached also removes the power dissipation that would otherwise be present during a transition due to both pull-up and pull-down transistors being partially on simultaneously. Consider the case when the input 22 and output 20 are initially low. Pull-down transistor 15 is conducting to keep the output low, but the second pull-down transistor 17 is not conducting, because it has been switched off by control signal S2. As the input signal level rises, transistor 15 gradually shuts off, while pull-up transistors 11 and 13 gradually turn on and begin to conduct. Although a conduction path is opened between $V_{dd}$ and $V_{ss}$, this path has relatively high resistance due to the relatively small size of transistor 15 and the fact that the larger pull-down transistor 17 remains off. Thus, power dissipation is insignificant. Likewise, during a transition from high to low, pull-up transistor 13 is off due to control signals S1 and $\overline{S1}$. Although transistors 11, 15 and 17 are simultaneously partially on as transistor 11 gradually shuts off and pull-down transistors 15 and 17 gradually turn on, the relatively high resistance of transistor size keeps current flow to a minimum. With the exemplary output transistor sizes given previously, power consumption through this conductive path is typically less than 10 µA/mHz.

Referring again to FIG. 2, the buffer circuit uses n-channel pull-up transistors 47 in its translators to reduce leakage current. One problem with conventional translators that use a p-channel transistor in that location is that they leak current whenever the input level is between 3 V and 4 V. Then for $V_{dd}=5$ V, both p-channel pull-up transistors and both n-channel pull-down transistors are partially conducting. The current flow is substantial, since the node between the two pull-up devices is at $V_{dd}=5$ V while the gate voltage on the device 43 is at $V_{in}=3$ V and current is proportional to $[V_{gate}-V_{source}]^2$. In the translators of the present invention, the use of an n-channel pull-up device 47 causes the node between the pull-up devices 47 and 43 to be a threshold drop below $V_{dd}$, i.e. about 4 V, and so leakage current through the p-channel device 43 is about 75% less.

For similar reasons the weak pull-up transistors 95 and 99 off of the signal lines leading to inverter 21 and p-channel output transistor 13 and activated by inverters 93 and 97 respectively ensure that, when those lines 32 and 34 go high, they are pulled completely up to $V_{dd}=5$ V. This will prevent leakage current through the inverter 21's p-channel device and the p-channel transistor 13, since their gates will be maintained at $V_{dd}$.

In the overall buffer circuit seen in FIG. 1, the use of an n-channel pull-up device 11 for one of the output transistors reduces power dissipation as the output line 19 transitions between low (0 V) and high (preferably above 3.4 V). The power needed to cause such transitions in a capacitive circuit is $CV^2f$, where C is the capacitance of the circuit, V is the voltage change, and f is the frequency. The capacitance C is made up of components from the trace on the printed circuit board to which the chip is connected and that from the pins connecting the chip to the trace. Power dissipation is minimized when the voltage swing is limited to not more than 3.8 V. In the present buffer circuit, recall that p-channel pull-up transistor 13 starts pulling the output up and then is switched off by control signals S1 and $\overline{S1}$ when the input level rises above about 2.2 V. Then n-channel transistor 11 completes the pull-up. However, because it is an n-channel device, it can only pull it up to a threshold drop below $V_{dd}$, i.e. about 3.8 V. Accordingly, power consumption is minimized by the limited voltage swing. Alternatively, if CMOS output levels are desired, a p-channel transistor must be used in place of transistor 11 in order to pull the output line 19 all the way up to the power supply voltage $V_{dd}$.

Figure 3:
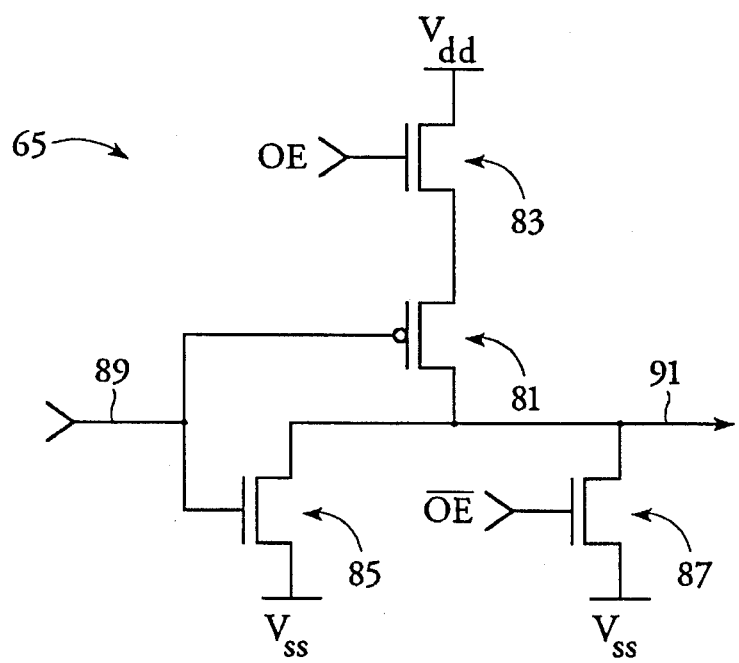
FIG. 3 is a schematic transistor level diagram of a NOR gate used in the feedback portion of the buffer circuit of FIG. 1.

In FIG. 3, a NOR gate 65 with 2.2 V transition voltage includes series pull-up transistors 81 and 83 and parallel pull-down transistors 85 and 87. One pull-up and one pull-down transistor 81 and 85 are connected to the input 89, while the other transistors 83 and 87 received enable control signals OE and $\overline{OE}$ for when the buffer is tristated. The pull-up transistor 83 closest to the power supply line $V_{dd}$ is an n-channel device to provide a threshold drop to reduce power consumption by p-channel pull-up transistor 81. Typical process dependent transistor sizes are 22.5/0.8 for transistor 83, 16/0.8 for transistor 81, 25/0.8 for transistor 85 ad 8/0.8 for transistor 87.

The buffer circuit of the present invention is thus seen to be fast, have low power consumption, reduced ground bounce or overshoot of the output signal, and input noise spike rejection.

I claim:

1. A buffer circuit, comprising a first pair of tristate input translators connected in parallel to an input of the circuit, each input translator being characterized by a ramp rate for a signal transition that is at most two times higher at its output than at its input, a first set of pull-up and pull-down output transistors connected in series between first and second voltage supply lines with an output node formed between said pull-up and pull-down output transistorst said input translators driving respective control gates of said pull-up and pull-down output transistors, wherein said input translator that drives said pull-up transistor of said first set of output transistors has an input transition voltage that is lower than a nominal transition voltage of the circuit and said input translator that drives said pull-down transistor of said first set of output transistors has a different input transition voltage that is higher than said nominal transition voltage, said nominal transition voltage being between voltage levels of said first and second voltage supply lines and between predefined logic low and logic high voltage levels for input signals received at said input of the circuit, and means connected in parallel with said input translators to said control gates for shutting off said pull-up and pull-down output transistors whenever said input translators are in a high impedance state.

2. The buffer circuit of claim 1 further comprising a second set of pull-up and pull-down output transistors connected in series between said first and second voltage supply lines in parallel with said first set of pull-up and pull-down output transistors with said output node also connected between said pull-up and pull-down output transistors of said second set, and a second pair of tristate input translators connected in parallel with each other and with said first pair of tristate input translators to said input of the circuit, each of said second pair of input translators also being characterized by a ramp rate for a signal transition that is at most two times higher at its output than at its input, said second pair of tristate input translators driving respective control gates of said second set of pull-up and pull-down output transistors.

3. A buffer circuit, comprising a first pair of tristate input translators connected in parallel to an input of the circuit, each input translator being characterized by a ramp rate for a signal transition that is at most two times higher at its output than at its input, a first set of pull-up and pull-down output. transistors connected in series between first and second voltage supply lines with an output node formed between said pull-up and pull-down output transistors, said input translators driving respective control gates of said pull-up and pull-down output transistors, wherein said input translator that drives said pull-up transistor of said first set of output transistors has an input transition voltage that is lower than a nominal transition voltage of the circuit and said input translator that drives said pull-down transistor of said first set of output transistors has a different input transition voltage that is higher than said nominal transition voltage, said nominal transition voltage being between voltage levels of said first and second voltage supply lines and between predefined logic low and logic high voltage levels for input signals received at said input of the circuit, a second set of pull-up and pull-down output transistors connected in series between said first and second voltage supply lines in parallel with said first set of pull-up and pull-down output transistors with said output node also connected between said pull-up and pull-down output transistors of said second set, a second pair of tristate input translators connected in parallel with each other and with said first pair of tristate input translators to said input of the circuit, each of said second pair of input translators also being characterized by a ramp rate for a signal transition that is at most two times higher at its output than at its input, said second pair of tristate input translators driving respective control gates of said second set of pull-up and pull-down output transistors, and means responsive to a voltage level of said output node and connected to said control gates of said second set of pull-up and pull-down output transistors for shutting off said pull-up transistor of said second set during a low-to-high transition when said output node has exceeded a first voltage level and shutting off said pull-down transistor of said second set during a high-to-low transition when said output node has fallen below a second voltage level, said first and second voltage levels both being between voltage levels of said first and second voltage supply lines.

4. A buffer circuit, comprising first and second pull-up output transistors connected in parallel between a first voltage supply line and an output node, first and second pull-down output transistors connected in parallel between a second voltage supply line and said output node, first, second, third and fourth tristate input translators with inputs connected in common to an input terminal of the circuit and with outputs respectively driving said first and second pull-up and first and second pull-down output transistors, and feedback means connected to said output node for generating first and second control signals when said output node respectively exceeds a logic high transition voltage and falls below a logic low transition voltage, said first control signal being coupled to a tristate input of said second input translator driving said second pull-up output transistor, said second control signal being coupled to a tristate input of said fourth input translator driving said second pull-down output transistor.

5. The circuit of claim 4 wherein said first pull-up output transistor is an n-channel transistor.

6. The circuit of claim 4 wherein each input translator comprises a first n-channel pull-up transistor, a second p-channel pull-up transistor, a third n-channel pull-down transistor and a fourth n-channel pull-down transistor connected in series between said first and second voltage supply lines, said second and third transistors connected at their gates to said input terminal, said first and fourth transistors connected at their gates to a tristate input of said input translator, a node between said second and third transistors forming an output of said input translator.

7. The circuit of claim 4 wherein said second input translator has a first input transition voltage that is less than a nominal transition voltage of the circuit and said fourth input translator has a second input transition voltage that is greater than said nominal transition voltage of the circuit, said nominal transition voltage of the circuit being between predefined logic low and logic high voltage levels for input signals received at said input terminal.

8. The circuit of claim 4 wherein said feedback means comprises a first NOR gate with an input connected to said output node, said first NOR gate having a transition voltage substantially equal to said logic high transition voltage and providing said first control signal at an output thereof, and a second NOR gate with an input coupled to said output node via an inverter, said inverter having a transition voltage substantially equal to said logic low transition voltage, said second NOR gate providing said second control signal at an output thereof.

* * * * *